(12) United States Patent
Wang et al.

(10) Patent No.: US 8,482,369 B2
(45) Date of Patent: Jul. 9, 2013

(54) SINGLE SWITCH DUMP RESISTOR LADDER NETWORK FOR MAGNET QUENCH PROTECTION

(75) Inventors: Jian-She Wang, Florence, SC (US); Andrei G. Baikalov, Florence, SC (US); Timothy John Bergfeld, Florence, SC (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/285,603

(22) Filed: Oct. 31, 2011

(65) Prior Publication Data
US 2013/0106545 A1    May 2, 2013

(51) Int. Cl.
*H01F 1/00* (2006.01)
*H01F 6/00* (2006.01)

(52) U.S. Cl.
USPC .............................. 335/216; 335/296; 361/141

(58) Field of Classification Search
USPC .................. 335/216, 296–299; 361/16, 140, 361/141
See application file for complete search history.

(56) References Cited

U.S. PATENT DOCUMENTS

| | | | |
|---|---|---|---|
| 4,559,576 A * | 12/1985 | Ries | 361/19 |
| 4,680,666 A * | 7/1987 | Rios | 361/141 |
| 5,333,087 A | 7/1994 | Takechi et al. | |
| 5,731,939 A * | 3/1998 | Gross et al. | 361/19 |
| 6,960,914 B2 * | 11/2005 | Shen et al. | 324/319 |
| 2006/0176132 A1* | 8/2006 | Atkins et al. | 335/216 |
| 2006/0227471 A1* | 10/2006 | Tsuchiya et al. | 361/19 |
| 2011/0082043 A1* | 4/2011 | Wang et al. | 505/162 |

* cited by examiner

*Primary Examiner* — Bernard Rojas
(74) *Attorney, Agent, or Firm* — Ziolkowski Patent Solutions Group, SC (57) ABSTRACT

A superconducting magnet assembly is provided that includes a magnet protection system electrically coupled to a plurality of magnet coils to form a closed loop circuit. The magnet protection system includes a single superconducting switch to selectively connect a power supply to the plurality of magnet coils and also includes a plurality of dump resistors arranged to form a resistor ladder circuit, with each of the plurality of dump resistors being connected between magnet coils forming a respective symmetric coil pair. The magnet protection system also includes a heater network connected between ends of the closed loop circuit and to the plurality of magnet coils, with the heater network configured to perform a quench-back operation to protect the plurality of magnet coils during quench and being driven by a partial-magnet coil voltage generated in a magnet coil upon initiation of a quench condition in the magnet coil.

22 Claims, 8 Drawing Sheets

SINGLE SWITCH DUMP RESISTOR LADDER NETWORK FOR MAGNET QUENCH PROTECTION

BACKGROUND OF THE INVENTION

Embodiments of the invention relate generally to medical imaging devices and other systems employing superconducting magnet systems and, more particularly, to a system and method for superconducting magnet quench protection.

As is known, a coil wound of superconductive material (a magnet coil) can be made superconducting by placing it in an extremely cold environment, (e.g., −269° C. or 4 K). For example, a coil may be made superconducting by enclosing it in a cryostat or pressure vessel containing a cryogen. The extreme cold enables the coil wires to be operated in a superconducting state. In this state, the resistance of the wires is practically zero. To introduce a current flow through the coils, a power source is initially connected to the coils through a superconducting switch that is temporarily operated in a normally conducting state. In the superconducting state, the current will continue to flow through the coils, thereby maintaining a strong magnetic field. In other words, because superconductive windings offer little to no resistance to electrical current flow at low temperatures, the superconducting state of the magnet is persistent. The electric current that flows through the superconducting magnet is maintained within the magnet and does not decay noticeably with time.

Superconducting magnets have wide applications in the field of magnetic resonance imaging ("MRI"). In a typical MRI magnet, the main superconducting magnet coils are enclosed in a cylindrically shaped cryogen pressure vessel containing a cryogen, such as liquid helium. The cryogen vessel is contained within an evacuated vessel and formed with an imaging bore in the center. The main magnet coils develop a strong magnetic field in the imaging volume of the axial bore that, when combined with controlled gradient magnetic fields and RF pulses, act to generate a signal from a patient that is received and processed to form an image. In existing MRI systems, a main magnetic field of 1.5 or 3 Tesla is routinely used to produce vivid clinical images.

When employing superconducting magnets for producing a strong magnetic field, it is important to have a robust protection system in place for responding to a phenomenon of "quenching" that may occur, in which a localized portion of the magnet increases in temperature and loses superconductivity. This localized increase in temperature can burn or damage the superconducting coils of the magnet. In addition, the rapid decrease in the molecular density due to boil-off within the cryogen vessel resulting from a sharp temperature rise reduces the insulating ability normally provided by the liquid helium, resulting in possible voltage breakdown through the gas that can seriously damage the various coils and associated control circuitry of the elements within the cryogen vessel.

In order for protection systems of superconducting magnets to work effectively, such protection systems should provide early quench detection and effective quench-back. As an example, for a magnet wound with superconducting wires having fiber glass cloth insulation, an initial normal zone is likely to grow relatively slowly, due to the cryogen that may be present between the magnet wire turns. It may take a certain amount of time to grow a detectable quench voltage signal of several volts up to tens of volts. By this time, a local hot spot may have a temperature at ~100K already. If no action is taken, temperature at the spot may rapidly reach an excessive level that would compromise the magnet coil construction. Therefore, it is crucial that the quench signal be detected in a timely manner and that timely action be taken to quench other parts of the magnet coil system. The action is often termed as quench-back. Typically this is achieved through a distributed heater network attached to predetermined strategic locations of the magnet coils.

Figure 1:
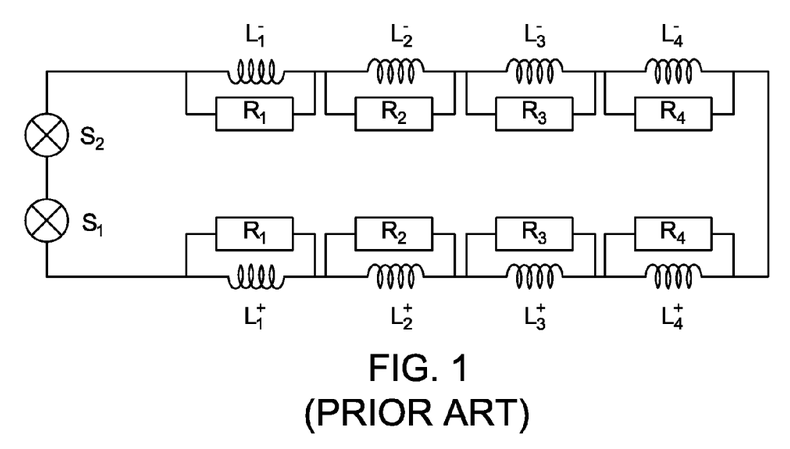
FIG. 1 is a schematic block diagram of a prior art superconducting magnet quench protection system.

FIG. 1 shows a typical prior art superconducting magnet protection system for a superconducting magnet having eight magnet coils L1(±)-L4(±) connected in series. The protection system includes two superconducting switches S1, S2 connected in series as part of a closed loop that is formed to support a desired operating current. As shown in FIG. 1, each magnet coil L1(±)-L4(±) is shunted using a respective protection resistor R1-R4 included in the protection system. In operation of the protection system, if one magnet coil L1(−) starts losing superconductivity (i.e., quenching), a voltage will show up in the magnet coil. However, the coil voltage (which is the quench signal) grows rather slowly and will not reach a very high level due to the shunting resistor R1−, thus making detection of the voltage difficult. To overcome the problem, the small voltage/quench signal is used to normalize the second superconductive switch S2. When the switch S2 normalizes, a voltage of a substantially higher amount is rapidly produced across the switch. Upon detection of this voltage, a heater network (not shown) connected across the switch S2 is triggered, and a coil quench-back function is then activated.

As an example, for the magnet protection system of FIG. 1, it may take a time corresponding to up to 20% of total magnet quench time to have a voltage of several volts in the quenching coil, which triggers the second protection switch S2 to derive a useful quench-back voltage. While this configuration of the magnet protection system thus provides for quench detection, it has two main disadvantages. First, the configuration of the magnet protection system of FIG. 1 results in a fairly large unbalanced electromagnetic quench force that must be supported by the cryostat structure. Second, the configuration of the magnet protection system of FIG. 1 requires the use of a second superconductive switch S2.

Figure 2:
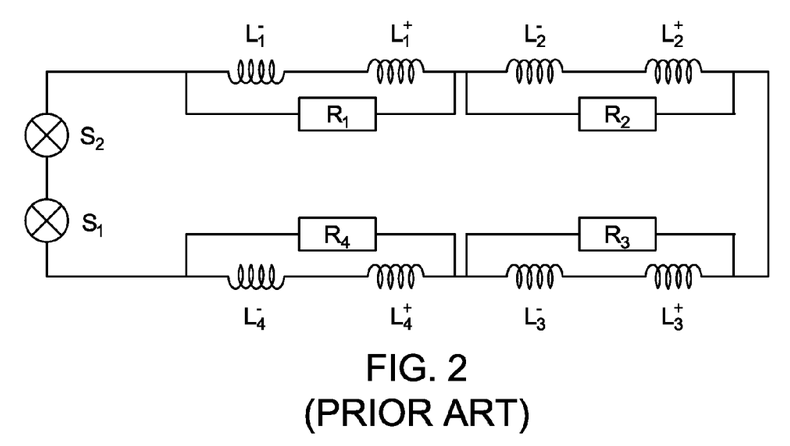
FIG. 2 is a schematic block diagram of a prior art superconducting magnet quench protection system.

Another prior art superconducting magnet protection system is illustrated in FIG. 2. In this design, symmetric magnet coil pairs L1(±)-L4(±) (with respect to the magnet mid-plane) are connected first and then shunted by a respective protection resistor. This connection forces electric current to be the same in the symmetric coil pair, thus eliminating the unbalanced quench force existing in the protection system of FIG. 1. Again, the net quench voltage in a shunted section grows slowly and does not reach a very high level due to the shunting resistors R1-R4, as such, it is necessary to use the second switch S2 to generate a higher voltage to drive the heater network (not shown) for coil quench-back. However, the superconducting magnet protection system of FIG. 2 has two disadvantages. One disadvantage is the complexity of coil leads routing since coil leads from one end of the coil former must be jointed together with those at the opposite end. The second disadvantage is that a second superconducting switch S2 must be employed to enable the quench-back.

Other prior art superconducting magnet protection systems, such as the one disclosed in U.S. Pat. No. 5,333,087 to Takechi et al., employ a plurality of diodes in a magnet protection circuit. In such magnet protection systems, the diodes have a predetermined turn-on voltage. Since the diodes shunt symmetrical coil pairs, the disclosed system provides for dumping most energy through only two coils, which is disadvantageous. Additionally, the use of diodes in the magnet protection system significantly increases the cost of the system, as the diodes must be properly sized to carry nearly full operating current.

It would therefore be desirable to provide a magnet quench protection system capable of providing early quench detection and effective quench-back. It would also be desirable to provide a magnet quench protection system that does not produce appreciable unbalanced quench electromagnetic force and that eliminates the need for a second superconductive switch, thus leading to lower cost protection design with less complexity for manufacturing.

BRIEF DESCRIPTION OF THE INVENTION

Embodiments of the invention provide a system and method for quench protection of a superconducting magnet in an automated fashion.

In accordance with one aspect of the invention, a superconducting magnet assembly includes a superconducting magnet coil assembly positioned within a vessel and comprising a plurality of magnet coils connected in series, with the plurality of magnet coils being arranged to form symmetric coil pairs such that the magnet coils corresponding to each respective symmetric coil pair are positioned on opposite sides of a center point of the superconducting magnet coil assembly. The superconducting magnet assembly also includes a power supply selectively coupled to the superconducting magnet coil assembly to supply power to the plurality of magnet coils so as to cause the superconducting magnet coil assembly to generate a magnetic field and a magnet protection system disposed within the vessel and electrically coupled to the plurality of magnet coils to form a closed loop circuit. The magnet protection system further includes a single superconducting switch connected between ends of the closed loop circuit to selectively connect the power supply to the superconducting magnet coil assembly, a plurality of dump resistors arranged to form a resistor ladder circuit, wherein each of the plurality of dump resistors is connected between magnet coils forming a respective symmetric coil pair, and a heater network connected between ends of the closed loop circuit and to the superconducting magnet coil assembly, with the heater network being configured to perform a quench-back operation to protect the plurality of magnet coils during quench. The heater network is driven by a partial-magnet coil voltage generated in a magnet coil in the plurality of magnet coils upon initiation of a quench condition in the magnet coil.

In accordance with another aspect of the invention, a method for quench protection of a superconducting magnet superconducting magnet coil assembly includes providing a superconducting magnet coil assembly having a plurality of magnet coils arranged in a series connection, with a first half of the plurality of magnet coils forming a first leg and a second half of the plurality of magnet coils forming a second leg and with the magnet coils on the first and second legs being arranged symmetrically in pairs. The method also includes connecting a quench protection system to the superconducting magnet coil assembly so as to form a closed loop circuit, with the quench protection system comprising a single superconducting switch, a heater network, and a plurality of dump resistors arranged to form a resistor ladder circuit, and wherein each of the plurality of dump resistors is connected between respective pairs of magnet coils on the first and second legs. The method further includes monitoring a voltage signal from at least one magnet coil to detect the onset of a quench condition, detecting the quench condition based on the monitored voltage signal, and activating a heater network upon detection of the quench condition, with the heater network configured to perform a quench-back operation to protect the plurality of magnet coils. The heater network is driven by the voltage of the at least one magnet coil that is present at the detection of the quench condition.

In accordance with yet another aspect of the invention, a superconducting magnet assembly includes a superconducting magnet coil assembly having a plurality of magnet coils arranged in a series connection, wherein a first half of the plurality of magnet coils forms a first leg and a second half of the plurality of magnet coils forms a second leg and wherein opposing magnet coils on the first and second legs are arranged in pairs. The superconducting magnet assembly also includes a quench protection system electrically coupled to the plurality of magnet coils so as to form a closed loop circuit therewith, with the quench protection system further including a single ramp switch connected between ends of the closed loop circuit to selectively provide power to the superconducting magnet coil assembly, a ladder network of dump resistors arranged so as to be connected between respective pairs of magnet coils on the first and second legs and configured to cause substantially equal magnitude positive and negative half-magnet coil voltages to be generated in a respective pair of magnet coils pair upon initiation of a quench event in a respective magnet coil, and at least one heater network connected between ends of the closed loop circuit and configured to perform a quench-back operation upon initiation of the quench event, with the heater network being driven by the half-magnet coil voltage generated upon initiation of the quench event.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENT

Embodiments of the present invention relate to management of superconductive magnets and, particularly, to the protection of such systems from quenching. Although reference is made in the following discussion to medical imaging systems, it is recognized that embodiments of the invention are applicable to a range of systems or devices that utilize superconducting magnets, such as spectroscopy systems and the like.

Figure 3:
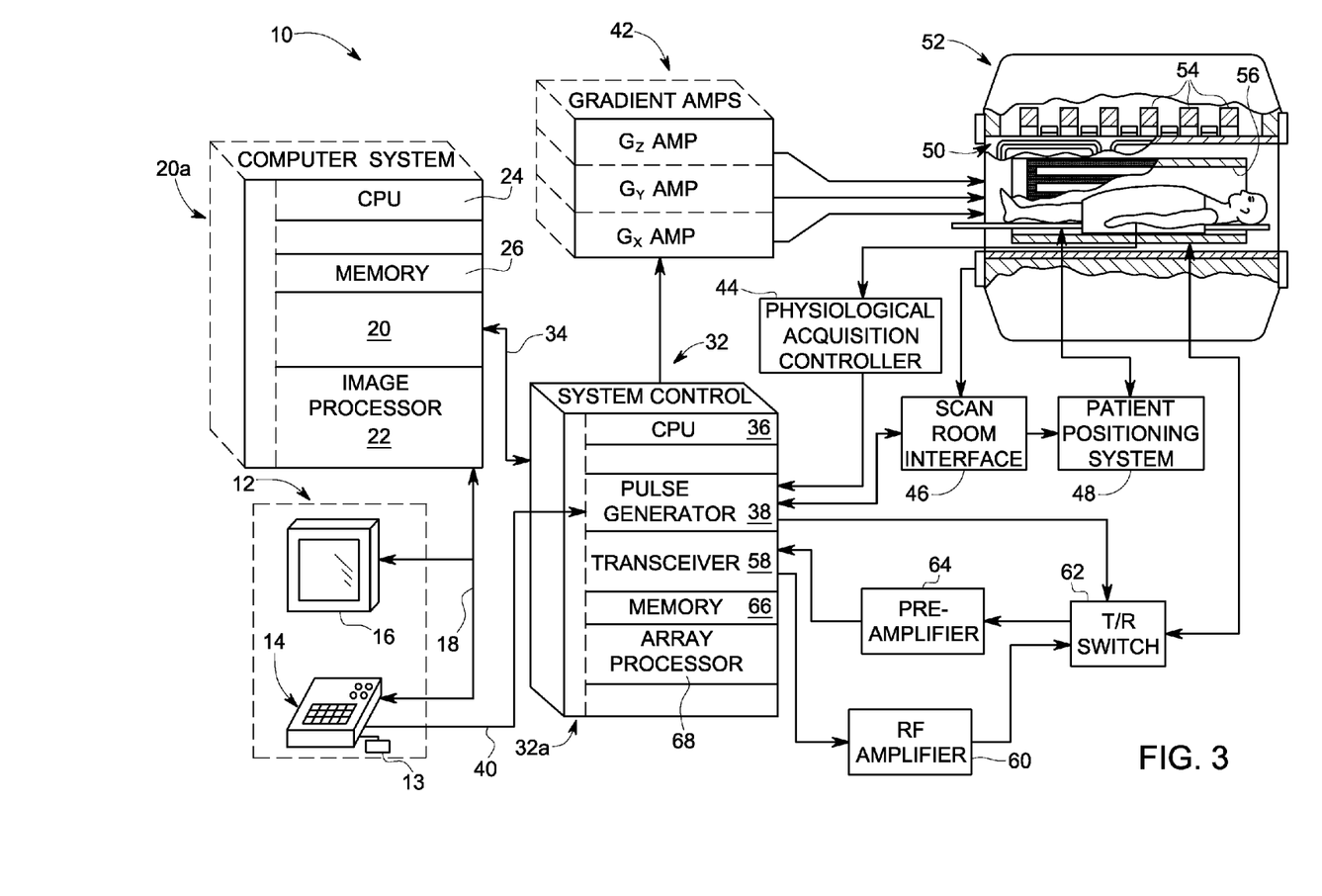
FIG. 3 is a schematic block diagram of an exemplary MR imaging system for use with an embodiment of the invention.

Referring to FIG. 3, the major components of a magnetic resonance imaging (MRI) system 10 are shown for use with embodiments of the invention. The operation of the MRI system 10 is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, which may include a frame buffer for storing image data arrays. The computer system 20 communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. The polarizing magnet 54 is configured and operated as a superconducting magnet (i.e., kept at a superconducting temperature) to generate a main magnetic field of, for example, 3 Tesla. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 4:
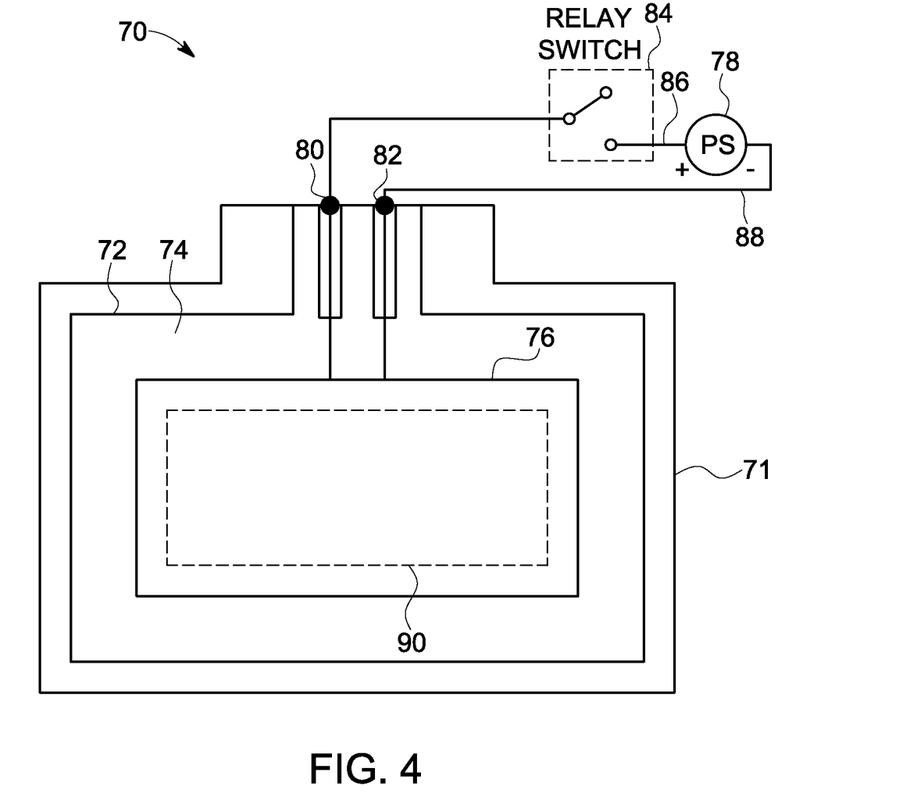
FIG. 4 is a schematic block diagram of a superconducting magnet assembly according to an embodiment of the invention.

Turning to FIG. 4, a superconducting magnet assembly 70 in accordance with an embodiment of the invention is shown, such as could be incorporated into MR system 10 of FIG. 3. Superconducting magnetic assembly 70 comprises an outer vacuum vessel 71 within which is positioned a cryogen pressure vessel 72. The cryogen pressure vessel 72 is filled with a cryogen 74 (e.g., liquid helium) so as to provide cooling to components within cryogen pressure vessel 72. While not shown in FIG. 4, it is to be understood that cryogen pressure vessel 72 may be cylindrically formed to have a central bore portion there through, which acts as a central imaging bore in MRI applications. However, the invention is not limited to applications having such a cylindrical geometry with central imaging bore, and cryogen pressure vessel 72 may be formed in any suitable manner for containment of superconducting magnet coils therein. Furthermore, it is to be understood that the vessel does not have to be filled with a cryogen, but could instead house a conduction-cooled superconducting magnetic assembly. Alternatively, a superconducting magnet assembly could be cooled by a closed cryogen loop.

A superconducting magnet coil assembly 76 is disposed within cryogen pressure vessel 72 and includes a plurality of superconducting magnet coils (not shown). During a magnet ramp mode of operation (i.e., when a magnet is charged to full current, or when a magnet is ramped down), superconducting magnet coil assembly 76 is electrically connected to a power supply 78 via a pair of permanently embedded leads 80, 82 in cryogen pressure vessel 72. Power supply 78 may be permanently affixed in superconducting magnetic assembly 70 or may be detached after ramp operation to act as a service tool only during a magnet ramp mode. A relay switch 84 is actively positioned so as to couple a positive terminal 86 of power supply 78 to permanently embedded lead 80 and a negative terminal 88 of power supply 78 to permanently embedded lead 82. Relay switch 84 may be any appropriate switch, e.g., MGBT-based or mechanical. Using this configuration during magnet ramp mode of operation, superconducting magnet coil assembly 76 is energized to form a coil series circuit capable of providing a magnetic field in the central imaging bore of cryogen pressure vessel 72.

It is recognized that, during operation of the superconducting magnet assembly 70, quenching of the superconducting magnet coil assembly 76 may occur should the temperature of the superconducting magnet coil assembly 76 go above the critical temperature of superconducting operation. Accordingly, in order to mitigate the undesired quench, superconducting magnetic assembly 70 further includes a magnet protection system (i.e., quench protection system) 100 that is integrated with the superconducting magnet coil assembly 76.

Various specific configurations of a magnet protection system 100, and the relationship thereof with respect to superconducting magnet coil assembly 76, are shown in FIGS.

Figure 5:
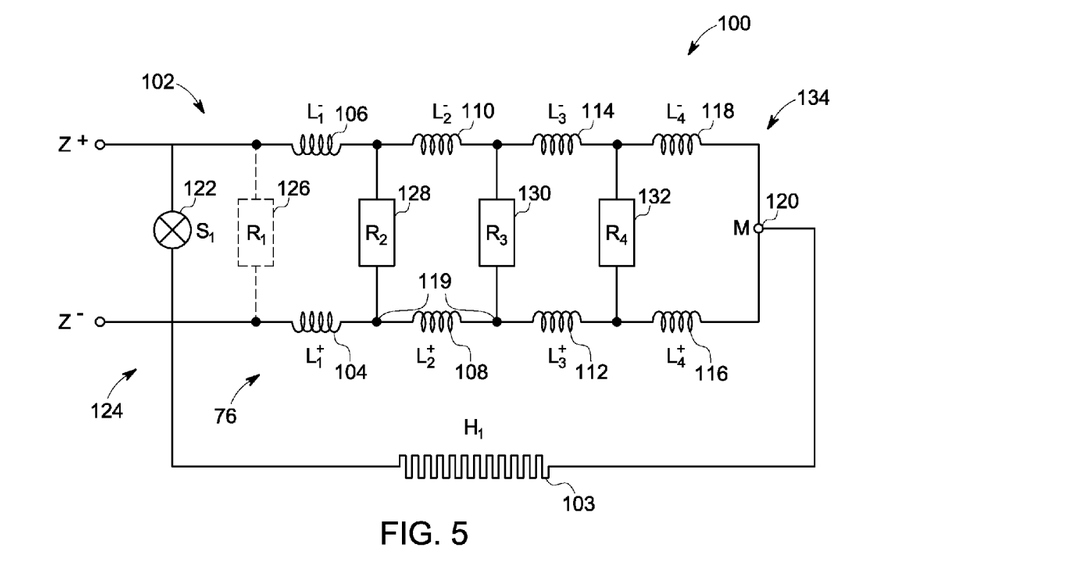
FIGS. 5-12 are schematic block diagrams of superconducting magnet quench protection systems according to embodiments of the invention.

5-11 according to embodiments of the invention. Referring first to FIG. 5, a configuration of magnet protection system 100, and the relationship thereof with respect to superconducting magnet coil assembly 76, is shown according to an embodiment of the invention. The magnet protection system 100 includes therein a dump resistor ladder circuit 102 configured to provide quench protection to superconducting magnet coil assembly 76. The dump resistor ladder circuit 102 provides for earlier detection of a quench by providing for the sensing of partial magnet coil voltage, such as a half magnet coil voltage. According to embodiments of the invention, the sensed voltage can be used to drive a quench-back heater network H1, designated as 103, for providing quench protection to the superconducting magnet coil assembly 76. The heater network H1 comprises a parallel and/or series combination of a plurality of heater elements that are thermally in contact with magnet coils.

As shown in FIG. 5, the superconducting magnet coil assembly 76 includes eight coils L1+, L1−, L2+, L2−, L3+, L3−, L4+, L4−, designated as 104-118 respectively, with all coils being connected in series in a sequential manner, although it is recognized that the magnet coil assembly 76 could include a different number of coils than that shown in FIG. 5. The coils are sequentially connected from z− end to z+ end preferably such that, by this arrangement, the point M, designated 120, is the mid-point of the magnet coil sequence. The plurality of magnet coils are arranged to form symmetric coil pairs (e.g., coil pair L1+, L1−, coil pair L2+, L2−, etc.) such that the magnet coils corresponding to each respective symmetric coil pair are positioned on opposite sides of midpoint M of the superconducting magnet coil assembly 76. A connection point 119 is disposed between each of the plurality of magnet coils to provide for resistor connection.

A single switch S1 (i.e., superconductive/ramp switch), designated 122, is included in magnet protection system 100, forming part of a closed loop circuit 124 that is formed to support an intended operating current. The switch S1 provides for operation of magnet protection system 100 in two distinct modes: a ramping mode and a persistent mode. During ramping up or ramping down of superconducting magnet coil assembly 76, a power supply (see FIG. 4, power supply 78) is connected to the plus and minus terminals z+, z−. A heater element (not shown) thermally contacts switch S1 and is energized so as to make S1 operate in a normal conducting mode, with the superconducting magnet coil assembly 76 then being ramped up or ramped down by means of the power supply. This is the ramping mode of operation. During the normal persistent operating mode, the switch S1 is put in superconducting mode and an electric current circulates in the zero-resistance closed loop circuit 124. As illustrated in FIG. 5, superconductive switch S1 is the only switch included in the magnet protection system 100, i.e., there is no need for a second superconductive switch.

Instead of shunting each coil or coil group, the magnet protection system 100 is configured to use a plurality of dump resistors R1, R2, R3, R4, designated as 126-132 respectively, positioned with respect to magnet coils L1 to L4 so as to form ladder circuit 102 (with R1 being optional, as shown in phantom). The dump resistors R1, R2, R3, R4 form the steps in the ladder circuit 102 and are made of a material that exhibits high electrical resistivity at low temperatures, such as stainless steel materials for example. The electrical resistance of these resistors R1, R2, R3, R4 is typically selected to be quite small, such as tens to hundreds of milliohms, although it is recognized that the resistors may have different resistance values that may be selected as a design tradeoff between allowed cryogen boil-off and the capability to clamp coil voltages.

As shown, a first half of the magnet coils L1− to L4− are arranged to form the first leg 134 of the ladder and a second half of the magnet coils L1+ to L4+ are arranged to form the second leg 136 of the ladder, with protection resistors R1 to R4 as steps on the ladder 102. The protection resistors are positioned symmetrically with respect to the magnet coils and, based on this symmetrical arrangement, electric currents in the two coils in each coil pair (e.g., coil pair L1+, L1−) at corresponding legs 134, 136 of the ladder arrangement will be substantially the same, having positive and negative values, with any differences in the positive and negative currents in the coil pairs resulting from (and being equal to) the level of voltage carried in the branch of heater network H1, or also possibly being a function of wire availability and/or temperature. Typically, the current of heater network H1 is much smaller than that of the magnet operating current and, as such, the ladder arrangement 102 of magnet protection system 100 does not produce appreciable unbalanced electromagnetic quench force.

The ladder arrangement 102 of magnet protection system 100 also provides for earlier quench detection. For example, in a case where the magnet coil L1− starts quenching, a voltage will show up therein. Based on the fact that the switch S1 is being either short-circuited during persistent operation mode or that its voltage is being bounded by the power supply (not shown) to typically a few volts during ramping, and further by means of the shunting effect of the small resistor R2, a voltage of opposite sign will also show up in the magnet coil L1+. The ladder arrangement 102 thus provides for the two opposite coils, such as magnet coils L1+, L1−, to have high voltage, with voltages in other coils being of smaller amplitude. The presence of the high voltage in the two opposite coils L1+, L1− promotes earlier detection for any coil quench initiation. That is, the voltages present in the magnet coils L1+, L1− rises very rapidly (e.g., a voltage of tens of volts in coils 104 and 106 may be yielded within an acceptable detection time window) and, as such, this sizable voltage enables earlier detection.

Since the voltage in magnet coils L1+, L1− is relatively high, direct use can be made of the voltage to drive quench-back heater network H1 (i.e., for use in a quench-back operation) without the use of a second superconductive switch, provided that this voltage will not exceed a predefined limit that is safe for the quench-back coil heater network H1. That is, the high voltage in the two opposite coils L1+, L1− promotes the sourcing of the net voltage from half of the magnet coils as the driver for the quench back heater network H1, with the heater network being connected from mid-point M to the switch S1, at either the plus or the minus terminal. The heater voltage of heater network H1 is basically equal to that of L1− coil and, since this voltage will rise rapidly, it will drive increasing current flow through heater network H1 to quench other coils.

Figure 6:
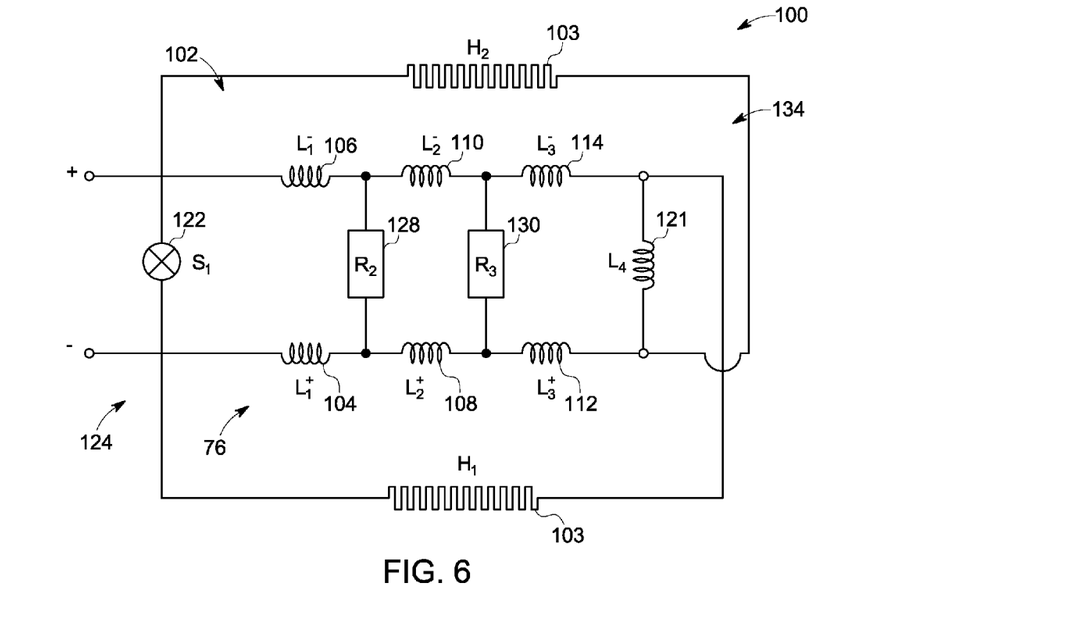
Figure 7:
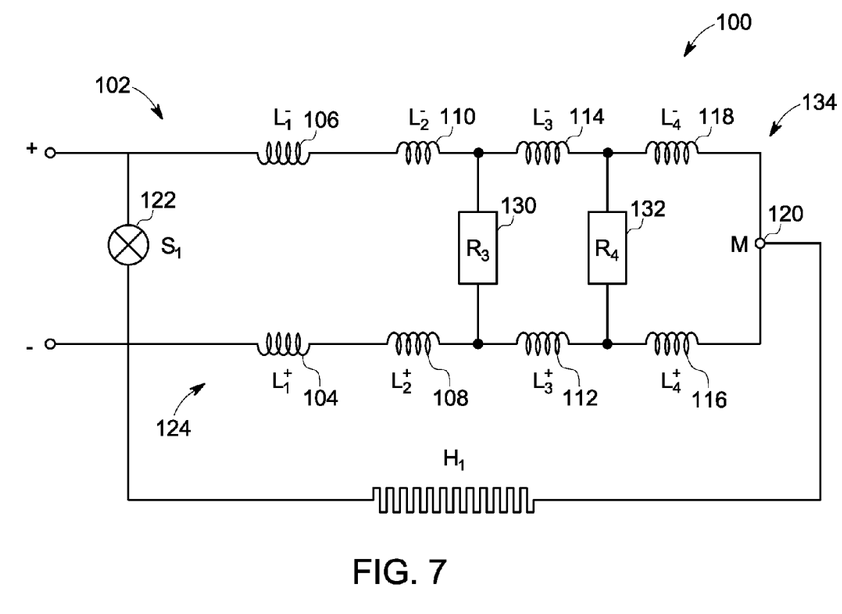

Referring to FIGS. 6 and 7, additional configurations of magnet protection system 100, and the relationship thereof with respect to superconducting magnet coil assembly 76, are shown according to embodiments of the invention. As shown in FIG. 6, in an embodiment where superconducting magnet coil assembly 76 has an odd number of coils, such as a last ladder section having three coils, no apparent mid-point M (e.g., mid-point 120 in FIG. 5) may be defined. In such an arrangement, there will be some voltage cancellation between magnet coils L3− and L4 (indicated as 121), and between L3+ and L4, due to mutual inductive coupling. In this case, two separate heater arrangements or heater networks H1 and H2, each indicated as 103, are included in magnet protection system 100 to provide effective heater quench-back. In FIG. 7, an embodiment is provided where two coils or sub-coils are arranged in one or more ladder sections, with L1 being a shielding coil or sub-coil, and L2 being a main coil or sub-coil. This arrangement forces current to be substantially the same in magnet coils L1− and L2− coils, and in magnet coils L1+ and L2+, with any differences in the positive and negative currents in the coil pairs resulting from (and being equal to) the level of voltage carried in the branch of heater network H1. This arrangement will thus reduce magnet 5-gauss line variation during quench events.

Figure 8:
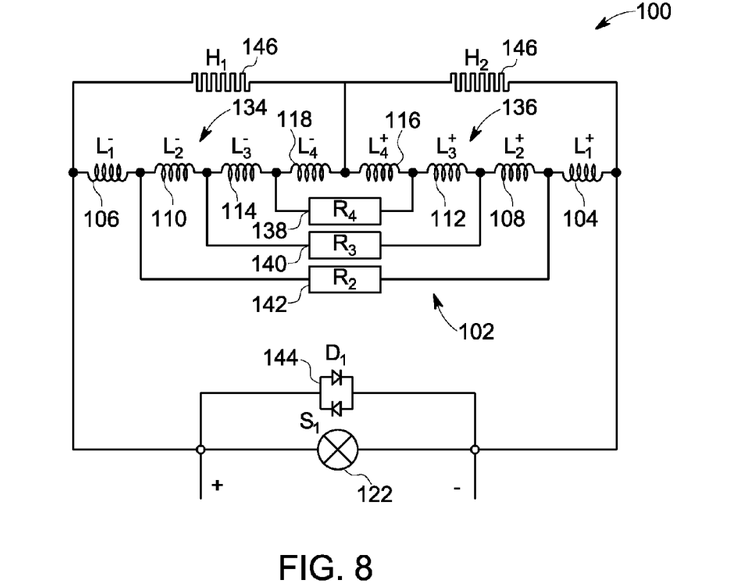

Referring now to FIG. 8, a representative design for a magnet protection system 100 is shown according to another embodiment of the invention. In the embodiment of FIG. 8, the magnet protection system 100 is formed in a ladder network or arrangement 102, with the magnet coils L1 to L4 being connected sequentially from one end to the other end of the magnet and resistors R2, R3, R4, designated as 138, 140, 142, traversing symmetrical points of the coil sequence to form the ladder configuration 102. Also included in magnet protection system 100 are a bi-directional diode pair D1, designated 144, and a single superconducting switch S1, with the bi-directional diode pair D1 being connected across the superconducting switch S1 instead of a resistor. Advantageously, the bi-directional diode pair D1 clamps the voltage of superconducting switch S1 to a very low level, acting as a safeguard during performance of magnet service.

One or more quench-back heater networks H1 and/or H2, designated as 146, are also included in magnet protection system 100. The quench-back heater network(s) H1, H2 is/are formed of one or more heaters attached at selected locations to the magnet coils L1 to L4 in a parallel, series, or combination configuration. According to an embodiment of the invention, a single quench-back heater network H1 is included in magnet protection system 100 and is attached to half of the magnet coils, such as the magnet coils L1− to L4− on the first leg 134 of the ladder arrangement 102. According to another embodiment of the invention, a second quench-back heater network H2 could be included in magnet protection system 100, such as shown in phantom in FIG. 8. The number and positioning of heater networks H1, H2 is determined based on design parameters that are selected so as to achieve effective quench-back.

Since heater network H1 traverses half of the magnet coils (i.e., magnet coils L1− to L4−), an important consideration in the configuration of the magnet protection system 100 is that the net voltage of half of the magnet coils should not exceed a certain limiting voltage threshold beyond which potential damage to heater network H1 may occur during quench. This voltage threshold depends on heater size, heat flux, cooling mode and other parameters. In the case where the half magnet coil voltage is too high, it may be necessary to reduce the said voltage. As this voltage is approximately equal to the voltage of one quenching coil, it is recognized that a coil may be sub-divided so as to lower the peak/high voltage experienced by the heater. Typically the highest voltage is present in the coil with most number of wire turns. Often when a coil has a high number of turns, it may become necessary to subdivide the coil due to length limit of the wire spool. In this case, the coil subdivision naturally provides heater voltage reduction.

Figure 9:
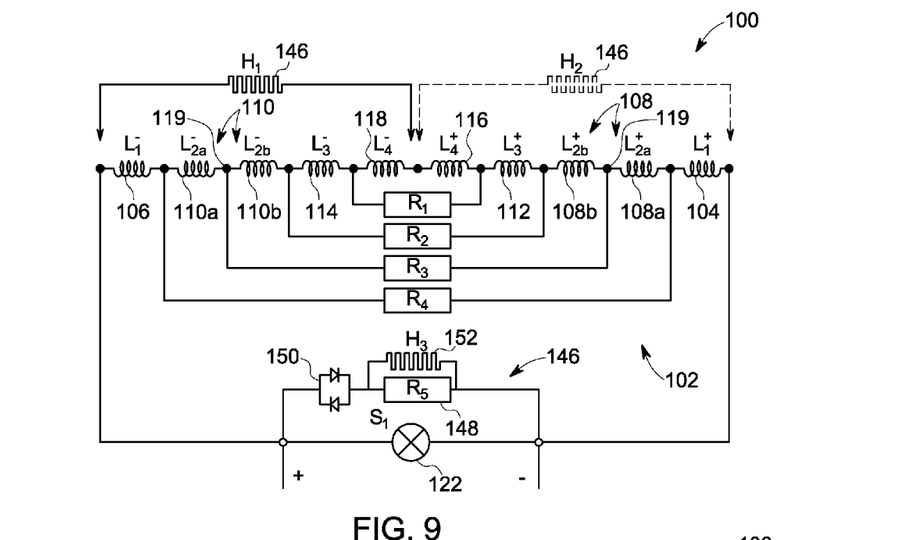

A magnet protection system where a magnet coil is divided into sub-coils to lower the peak/high voltage experienced by the heater network is provided in FIG. 9, according to another embodiment of the invention. As shown in FIG. 9, according to one embodiment, magnet coil L2− is subdivided into two sub-coils L2a− L2b−, designated as 110a, 110b respectively, such that the peak voltage experienced by coil L2− is lowered. While FIG. 9 shows magnet coil L2− divided into two sub-coils, it is recognized that magnet coil L2− could be subdivided into a greater number of sub-coils. Alternatively, and as shown in phantom in FIG. 9, magnet coil L2+ could be subdivided into two sub-coils L2a+L2b+, designated as 108a, 108b respectively, such that the peak voltage experienced by coil L2+ would be lowered. While the sub-coils L2a− L2b− may be either continuously wound or superconductively jointed, a mid-connection point 119 exists to allow resistor connection. The magnet coils L1 to L4 can still be sequentially connected as shown. Based on the sub-division of coil L2− into sub-coils L2a−, L2b−, the net peak voltage of heater network H1 is reduced. While this reduction in voltage may lead to a small delay with respect to detection of a quench event, the small time delay is minor since the coil voltage rises rapidly. It is recognized that the coil voltage is not necessarily scalable to the number of subdivisions, as the complexity of quench propagation involves multiple physical interactions.

The magnet protection system 100 of FIG. 9 also incorporates another mechanism for switch protection in the form of a resistor branch 146 including a resistor R5, designated as 148, and a diode-pair D1, designated as 150, connected across the superconductive switch S1. The resistance of resistor R5 may be selected to be relatively small, depending on magnet operating current and the characteristics of the superconductive switch S1. A heater network H3, designated as 152, is also connected then across the resistor branch 146, with H3 being in the form of either a single heater or a combination of multiple heaters. The heater network H3 may be advantageously positioned to one selected magnet coil. In operation, should the superconductive switch S1 quench first, the resistor branch 146 will have an acceptable voltage of proper level that is safe from a magnet service point of view. The heater network H3 may be sized accordingly so as to quench the selected coil, which subsequently drives the rest of the magnet coils to quench, and the heat dumped to superconductive switch S1 will be substantially reduced.

Figure 10:
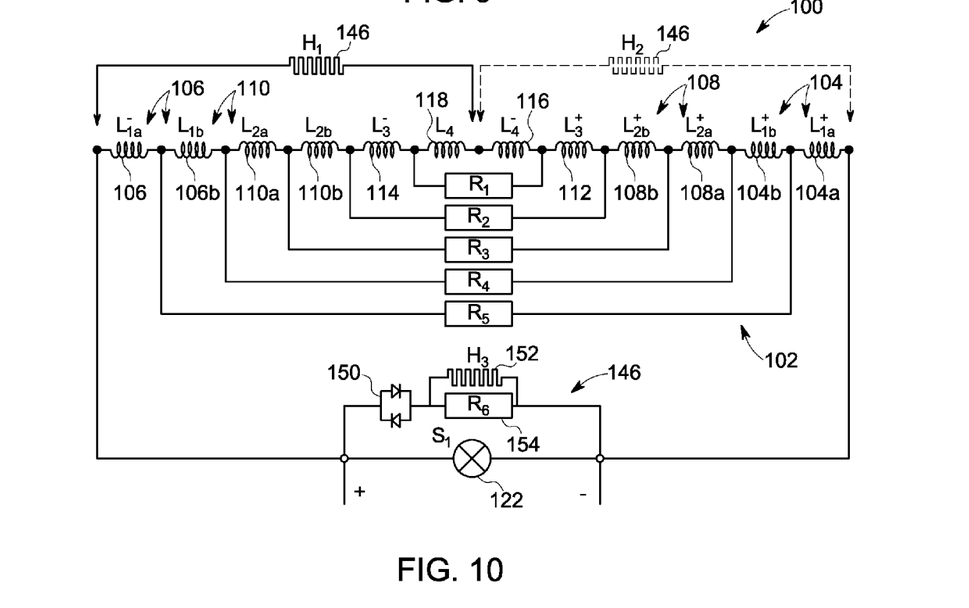

It is recognized that, depending on the field strength and/or size of the superconducting magnet being protected (i.e., conductor length), it may become necessary to subdivide more than one magnet coil. FIG. 10 illustrates a magnet protection system 100 according to another embodiment of the present invention, where the magnet coil L1− is subdivided into two sub-coils L1a− and L1b−, designated as 106a, 106b respectively, and the second magnet coil L2− is subdivided into two sub-coils L2a− and L2b−, designated as 110a, 110b respectively. According to other embodiments, it is recognized that magnet coil L1− and magnet coil L2− could each be subdivided into a greater number of sub-coils. Alternatively, and as shown in phantom in FIG. 10, magnet coil L1+ could be subdivided into two sub-coils L1a+ and L1b+, designated as 104a, 104b respectively, and the second magnet coil L2+ could subdivided into two sub-coils L2a+ and L2b+, designated as 108a, 108b respectively. Once again all the coils and/or sub-coils are connected sequentially and the heater network H1 (or H2) is attached to half of the magnet coils, such as the coils on first leg 134. A switch protection branch 146 including a resistor R6, designated as 154, heater H3, designated as 152, and diode-pair D1, designated as 150, is also provided to protect superconducting switch S1. The subdivision of magnet coil L1− into two sub-coils L1a− and L1b− and of the magnet coil L2− into two sub-coils L2a− and L2b− beneficially can achieve certain well-balanced coil current decay.

Figure 11:
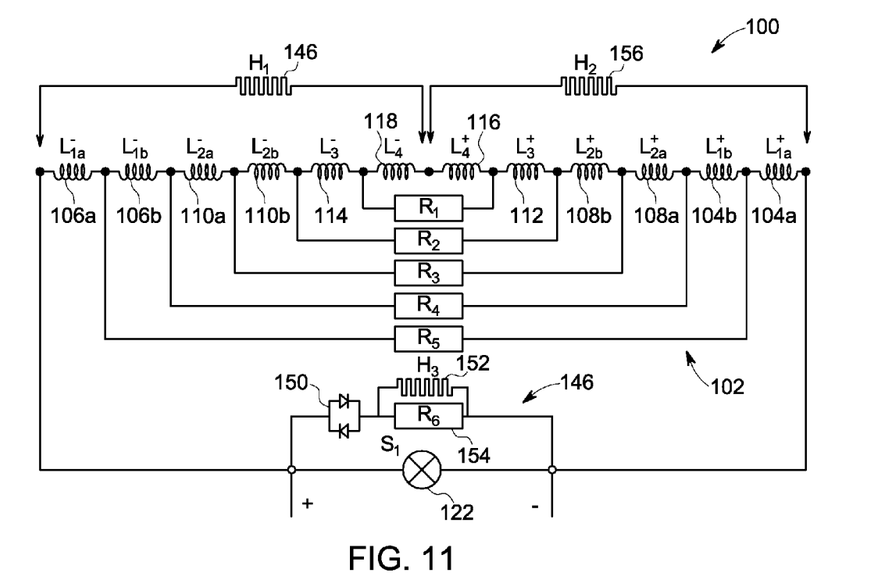

In some cases, it may be advantageous to implement more than one distributed heater network. In the case of two heater networks, one heater network H1 may be driven by voltage of half magnet coils while the second independent heater network H2 may be driven by voltage of less than half magnet coils (i.e., partial-magnet coil voltage) in order to emphasize a certain magnet coil or coils. Alternatively, the second heater network H2 may be driven by voltage of more than half of the magnet coils in order to de-emphasize certain a coil or coils. FIG. 11 shows an embodiment of a magnet protection system 100 where the heater network H1, designated as 146, is driven by the voltage of half the magnet coils (i.e., magnet coils L1− to L4−) and the heater network H2, designated as 156, is driven by driven by the voltage of less than half the magnet coils (i.e., magnet coils L1+, L2+).

Figure 12:
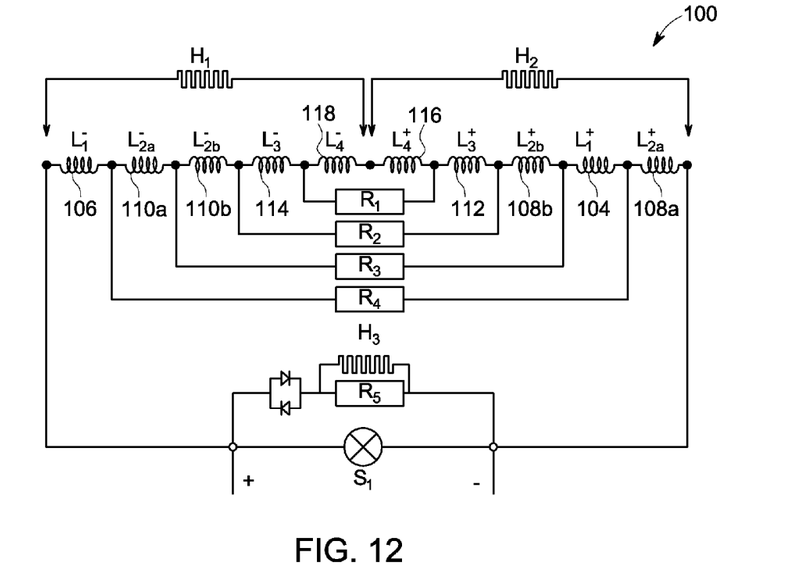

According to another embodiment of the invention, and as shown in FIG. 12, a magnet protection system 100 is constructed to have an asymmetrical ladder configuration/arrangement. That is, by exchanging the connection order of magnet coils L2a+ and L1+ (i.e., coils 108a and 104), the electric current is forced to be the same in the coil pairs, L1−, L2a+ and L1+, L2a− (i.e., coils 106, 108a and 104, 110a). When the two currents are out-of-synch during quench, a certain level of unbalanced electromagnetic force will be present that may still be allowed in the magnet coil supporting structure. Assuming that coil L1 is a reverse or shielding coil, the asymmetric arrangement has the advantage of achieving better overall fringe field shielding during quench.

Figure 13:
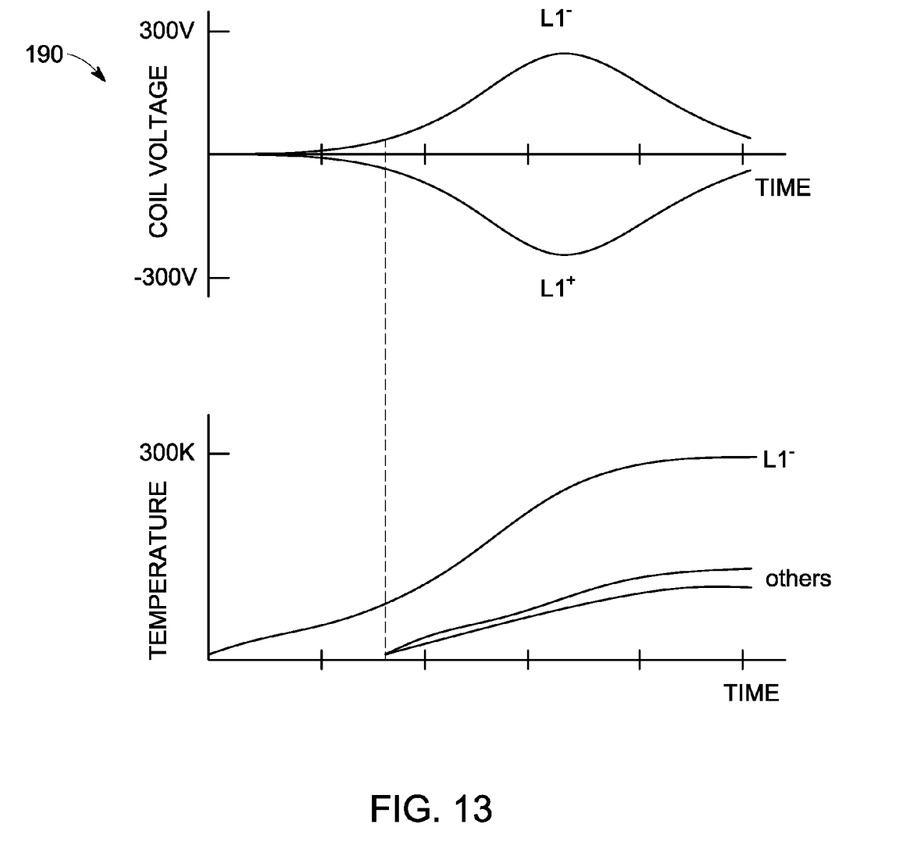
FIG. 13 is a graphical representation of simulated coil voltage and temperature profiles for magnet coils employing the superconducting magnet quench protection system of FIG. 9.

Referring now to FIG. 13, results 190 from a quench simulation performed using the quench protection system of FIG. 9 is illustrated. Assuming that the heaters included in heater network H1 are sized to tolerate up to 600 V of applied voltage and that a safety factor of two is provided in order to account for possible unknown errors in quench simulation, the peak heater voltage should be around 300 V. Without any design optimization in this exercise, a total of twenty such coils heaters are selected in the heater network H1. In operation, and as illustrated in FIG. 13, a quench signal of ~35 V is detected in ~1.5 time units after quench initiation in both a bucking coil quench and a large coil quench. The peak half-magnet coil voltage is seen to be less than 300 V that fulfills the intended heater safety factor of two. The highest hot-spot temperature by simulations occurs during a large coil top layer quench at ~320 K. The temperature can certainly be reduced further through optimization. Another parameter that is important is the peak layer-to-layer voltage. It is found that layer-to-layer voltage is around 100 V, so this is not a concern for this configuration. This example indicates that it is possible to achieve magnet quench protection using the proposed single switch magnet protection system 100.

Beneficially, embodiments of the quench protection system/circuit having a ladder network/arrangement of resistors, as set forth in detail above, provide a potentially lower cost quench protection design. Embodiments of the quench protection system/circuit provide acceptable symmetry in the system such that no substantial net unbalanced electromagnetic force is present. Embodiments of the quench protection system/circuit provide have a single switch circuit design, such that no secondary or quench protection switch is needed, thus lowering the cost of the quench protection system/circuit. Without the second switch, and without routing its pair leads, the magnet circuit connection is much simplified, leading to less manufacturing time. Furthermore, embodiments of the quench protection system/circuit make use primarily of dump resistors, with a single diode possibly being added for the single ramp switch. The use of a single diode as compared to conventional quench protection systems where a plurality of diodes are used, further lowers the cost of the quench protection system/circuit.

A technical contribution for the disclosed method and apparatus is that is provides for a system and method for superconducting magnet quench protection in an automated fashion.

Therefore, according to an embodiment of the invention, a superconducting magnet assembly includes a superconducting magnet coil assembly positioned within a vessel and comprising a plurality of magnet coils connected in series, with the plurality of magnet coils being arranged to form symmetric coil pairs such that the magnet coils corresponding to each respective symmetric coil pair are positioned on opposite sides of a center point of the superconducting magnet coil assembly. The superconducting magnet assembly also includes a power supply selectively coupled to the superconducting magnet coil assembly to supply power to the plurality of magnet coils so as to cause the superconducting magnet coil assembly to generate a magnetic field and a magnet protection system disposed within the vessel and electrically coupled to the plurality of magnet coils to form a closed loop circuit. The magnet protection system further includes a single superconducting switch connected between ends of the closed loop circuit to selectively connect the power supply to the superconducting magnet coil assembly, a plurality of dump resistors arranged to form a resistor ladder circuit, wherein each of the plurality of dump resistors is connected between magnet coils forming a respective symmetric coil pair, and a heater network connected between ends of the closed loop circuit and to the superconducting magnet coil assembly, with the heater network being configured to perform a quench-back operation to protect the plurality of magnet coils during quench. The heater network is driven by a partial-magnet coil voltage generated in a magnet coil in the plurality of magnet coils upon initiation of a quench condition in the magnet coil.

According to another embodiment of the invention, a method for quench protection of a superconducting magnet superconducting magnet coil assembly includes providing a superconducting magnet coil assembly having a plurality of magnet coils arranged in a series connection, with a first half of the plurality of magnet coils forming a first leg and a second half of the plurality of magnet coils forming a second leg and with the magnet coils on the first and second legs being arranged symmetrically in pairs. The method also includes connecting a quench protection system to the superconducting magnet coil assembly so as to form a closed loop circuit, with the quench protection system comprising a single superconducting switch, a heater network, and a plurality of dump resistors arranged to form a resistor ladder circuit, and wherein each of the plurality of dump resistors is connected between respective pairs of magnet coils on the first and second legs. The method further includes monitoring a voltage signal from at least one magnet coil to detect the onset of a quench condition, detecting the quench condition based on the monitored voltage signal, and activating a heater network upon detection of the quench condition, with the heater network configured to perform a quench-back operation to protect the plurality of magnet coils. The heater network is driven by the voltage of the at least one magnet coil that is present at the detection of the quench condition.

According to yet another embodiment of the invention, a superconducting magnet assembly includes a superconducting magnet coil assembly having a plurality of magnet coils arranged in a series connection, wherein a first half of the plurality of magnet coils forms a first leg and a second half of the plurality of magnet coils forms a second leg and wherein opposing magnet coils on the first and second legs are arranged in pairs. The superconducting magnet assembly also includes a quench protection system electrically coupled to the plurality of magnet coils so as to form a closed loop circuit therewith, with the quench protection system further including a single ramp switch connected between ends of the closed loop circuit to selectively provide power to the superconducting magnet coil assembly, a ladder network of dump resistors arranged so as to be connected between respective pairs of magnet coils on the first and second legs and configured to cause substantially equal magnitude positive and negative half-magnet coil voltages to be generated in a respective pair of magnet coils pair upon initiation of a quench event in a respective magnet coil, and at least one heater network connected between ends of the closed loop circuit and configured to perform a quench-back operation upon initiation of the quench event, with the heater network being driven by the half-magnet coil voltage generated upon initiation of the quench event.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A superconducting magnet assembly comprising:
    a superconducting magnet coil assembly positioned within a vessel and comprising a plurality of magnet coils connected in series, the plurality of magnet coils being arranged to form symmetric coil pairs such that the magnet coils corresponding to each respective symmetric coil pair are positioned on opposite sides of a center point of the superconducting magnet coil assembly;
    a power supply selectively coupled to the superconducting magnet coil assembly to supply power to the plurality of magnet coils so as to cause the superconducting magnet coil assembly to generate a magnetic field; and
    a magnet protection system disposed within the vessel and electrically coupled to the plurality of magnet coils to form a closed loop circuit, the magnet protection system comprising:
        a single superconducting switch connected between ends of the closed loop circuit to selectively connect the power supply to the superconducting magnet coil assembly;
        a plurality of dump resistors arranged to form a resistor ladder circuit, wherein each of the plurality of dump resistors is connected between magnet coils forming a respective symmetric coil pair; and
        a heater network connected between ends of the closed loop circuit and to the superconducting magnet coil assembly, the heater network being configured to perform a quench-back operation to protect the plurality of magnet coils during quench;
        wherein the heater network is driven by a partial-magnet coil voltage generated in a magnet coil in the plurality of magnet coils upon initiation of a quench condition in the magnet coil.

2. The superconducting magnet assembly of claim 1 wherein the magnet protection system further comprises a bi-directional diode pair connected across the superconducting switch and configured to clamp the voltage of the superconducting switch.

3. The superconducting magnet assembly of claim 1 wherein the heater network comprises a plurality of heater elements arranged in one of a parallel, series, or combination configuration, and thermally coupled to the magnet coils.

4. The superconducting magnet assembly of claim 1 wherein the heater network is connected to half of the plurality of magnet coils, so as to be driven by a half-magnet coil voltage.

5. The superconducting magnet assembly of claim 1 wherein at least one of the plurality of magnet coils is subdivided into a plurality of sub-coils.

6. The superconducting magnet assembly of claim 1 wherein the magnet protection system further comprises:
    a resistor branch connected across the superconducting switch; and
    a heater network connected across the resistor branch and configured to perform a quench-back operation for a selected magnet coil in the plurality of magnet coils.

7. The superconducting magnet assembly of claim 1 wherein the heater network comprises a first heater network and wherein the magnet protection system further comprises a second heater network, the first heater network being driven by a half magnet coil voltage and the second heater network being driven by one of a less-than-half magnet coil voltage and a greater-than-half magnet coil voltage.

8. The superconducting magnet assembly of claim 1 wherein the plurality of magnet coils is sequentially arranged so as to provide a substantially symmetrical magnet protection system having reduced unbalanced electromagnetic forces.

9. The superconducting magnet assembly of claim 1 wherein the plurality of dump resistors in the magnet protection system are configured to cause approximately equal magnitude positive and negative half-magnet voltages to be generated in a symmetric coil pair upon initiation of a quench condition in a magnet coil in the respective symmetric coil pair.

10. The superconducting magnet assembly of claim 9 wherein the heater network is driven by the half-magnet voltage generated by the symmetric coil pair undergoing the quench condition and is configured to quench the remainder of the plurality of magnet coils.

11. The superconducting magnet assembly of claim 1 wherein the plurality of dump resistors comprises a number of dump resistors that is less than a number of magnet coils in the superconducting magnet coil assembly.

12. A method for quench protection of a superconducting magnet coil assembly comprising:
    providing a superconducting magnet coil assembly having a plurality of magnet coils arranged in a series connection, wherein a first half of the plurality of magnet coils forms a first leg and a second half of the plurality of magnet coils forms a second leg and wherein the magnet coils on the first and second legs are arranged symmetrically in pairs;
    connecting a quench protection system to the superconducting magnet coil assembly so as to form a closed loop circuit, the quench protection system comprising a single superconducting switch, a heater network, and a plurality of dump resistors numbering less than the plurality of magnet coils and being arranged to form a resistor ladder circuit, wherein each of the plurality of dump resistors is connected between respective pairs of magnet coils on the first and second legs;

monitoring a voltage signal from at least one magnet coil to detect the onset of a quench condition;

detecting the quench condition based on the monitored voltage signal; and activating a heater network upon detection of the quench condition, the heater network configured to perform a quench-back operation to protect the plurality of magnet coils;

wherein the heater network is driven by the voltage of the at least one magnet coil that is present at the detection of the quench condition.

13. The method of claim 12 wherein the monitored voltage signal that is used to drive the heater network upon detection of the quench condition comprises a partial-magnet coil voltage.

14. The method of claim 13 wherein the plurality of dump resistors in the quench protection system are configured to cause approximately equal magnitude positive and negative partial-magnet coil voltages to be generated in a respective symmetric pair of magnet coils pair upon initiation of the quench condition.

15. The method of claim 12 wherein the quench protection system further comprises a switch protection branch positioned across the superconducting switch, the switch protection branch including at least one of a bi-directional diode pair and combination resistor and branch heater network.

16. The method of claim 12 wherein at least one of the plurality of magnet coils is subdivided into two or more sub-coils.

17. The method of claim 12 wherein the plurality of magnet coils are arranged in either a sequential or non-sequential arrangement, so as to provide either a balanced or non-balanced electromagnetic force in the superconducting magnet coil assembly.

18. A superconducting magnet assembly comprising:
a superconducting magnet coil assembly having a plurality of magnet coils arranged in a series connection, wherein a first half of the plurality of magnet coils forms a first leg and a second half of the plurality of magnet coils forms a second leg and wherein opposing magnet coils on the first and second legs are arranged in pairs; and a quench protection system electrically coupled to the plurality of magnet coils so as to form a closed loop circuit therewith, the quench protection system comprising:
a single ramp switch connected between ends of the closed loop circuit to selectively provide power to the superconducting magnet coil assembly;
a ladder network of dump resistors arranged so as to be connected between respective pairs of magnet coils on the first and second legs, the ladder network of dump resistors configured to cause substantially equal magnitude positive and negative half-magnet coil voltages to be generated in a respective pair of magnet coils pair upon initiation of a quench event in a respective magnet coil; and
at least one heater network connected between ends of the closed loop circuit and configured to perform a quench-back operation upon initiation of the quench event, the heater network being driven by the half-magnet coil voltage generated upon initiation of the quench event.

19. The system of claim 18 wherein the quench protection system further comprises a switch protection branch positioned across the ramp switch, the switch protection branch including at least one of a bi-directional diode pair and a combination of a resistor and branch heater network.

20. The system of claim 18 wherein at least one of the plurality of magnet coils is subdivided into a plurality of sub-coils.

21. The system of claim 18 wherein the at least one heater network is connected to one of the first half and the second half of the plurality of magnet coils.

22. The system of claim 18 wherein the dump resistors are composed of a stainless steel material that exhibits a desired level of electrical resistivity.

* * * * *